United States Patent [19]

Kameya

[11] Patent Number: 4,525,691
[45] Date of Patent: Jun. 25, 1985

[54] VARIABLE DELAY LINE
[75] Inventor: Kazuo Kameya, Saitama, Japan
[73] Assignee: Elmec Corporation, Saitama, Japan
[21] Appl. No.: 467,636
[22] Filed: Feb. 18, 1983
[30] Foreign Application Priority Data Feb. 22, 1982 [JP] Japan .................................. 57-27137

[51] Int. Cl.³ .............................................. H03H 7/32
[52] U.S. Cl. ..................................... 333/139; 333/23; 333/140
[58] Field of Search .............................. 333/138–140, 333/156, 161, 162, 245, 23; 336/69, 149, 150, 229

[56] References Cited

U.S. PATENT DOCUMENTS 1,641,432  9/1927  Hubbard ............................. 333/138
2,619,537  11/1952  Kihn .................................. 333/162
2,943,277  6/1960  Lewis ................................. 333/162
3,602,846  8/1971  Hauser ............................... 333/140

Primary Examiner—Marvin L. Nussbaum
Attorney, Agent, or Firm—Sughrue, Mion, Zinn, Macpeak, and Seas

[57] ABSTRACT

A lumped constant type ultra-high speed variable delay line includes an inductance element consisting of a single layer solenoid formed by winding a conductor with a prescribed pitch, a capacitor connected between said conductor and ground at each turn, a fixed contact array consisting of fixed contacts respectively formed on said each conductor at each turn of said inductance element, and a movable contact element for sliding on said fixed contact array while alternately making single-contact with one of said fixed contacts and multi-contact with adjacent fixed contacts.

8 Claims, 11 Drawing Figures

FIG. 1
FIG. 2
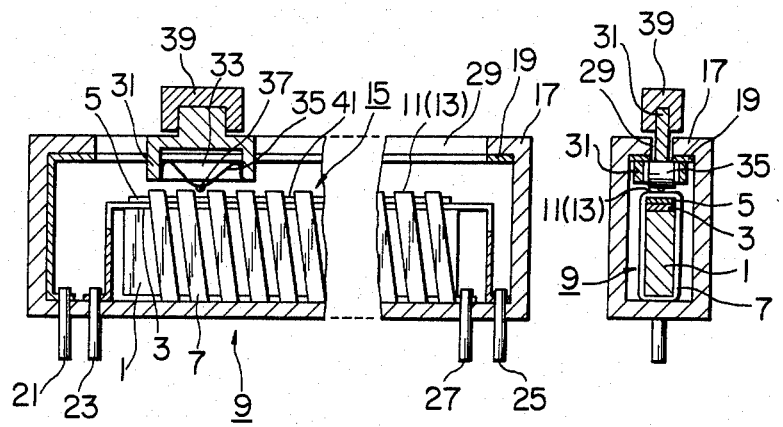
FIG. 3
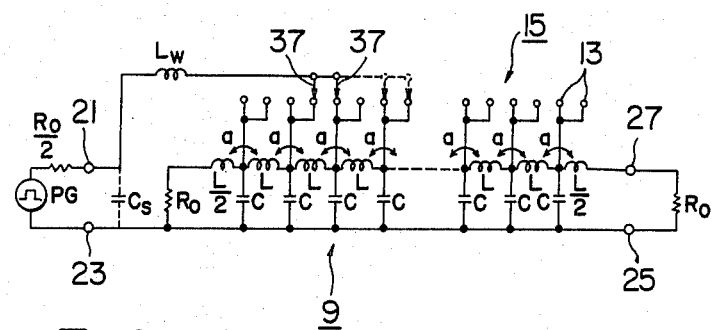
FIG. 4
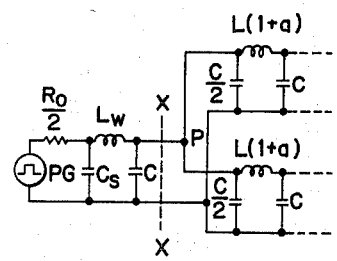
FIG. 5
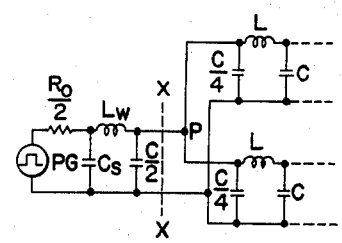

VARIABLE DELAY LINE

BACKGROUND OF THE INVENTION

1. Field of the Invention

The present invention relates to a variable delay line of a lumped constant type composed of a combination of an inductance element and plural capacitors, and more particularly to a subminiature variable delay line suitable for use with the digital circuits of a computer, etc., which enables the changeover of the delay time in precise intervals.

2. Description of the Prior Art

Hitherto, lumped constant and distributed constant variable delay lines have been available. A conventional delay line of the lumped constant type composed of a combination of plural coil units and capacitors connected so as to switchably connect a coil unit in order to vary the delay time has been publicly known.

However, such variable delay lines are liable to be large in size because the coil unit is switchably connected in order to vary the delay time. Furthermore the delay time may be varied only within the range of a simple multiplier td where the delay time of the coil unit is given by td. As a result, it is impossible to change the delay time in precise intervals, and accordingly an optimum adjustment of the delay time becomes difficult when the delay line is incorporated into an electronic apparatus such as a computer.

On the other hand, distributed constant variable delay lines are composed of a solenoid coil wound around a bobbin so as to interpose a delay due to the inter-electrode capacitance distributed between said coil and ground. The delay time is varied by sliding a sliding member on the coil. However, such distributed constant variable delay lines have a defect in that the rise time thereof is slow, so that a fast delay time characteristic may not be obtained.

As mentioned above, there has not been realized a variable delay line with a fast rise time and ultra high speed which enables the changeover of the delay time in precise intervals.

SUMMARY OF THE INVENTION

The present invention has been achieved to remedy the existing defects as mentined above.

A main object of the present invention is to provide a lumped constant variable delay line with a fast rise time which enables an adjustment to changeover the delay time in precise intervals.

Another object of the present invention is to provide a variable delay line with a delay time selection capability of almost two times the number of a changeover contacts.

Another object of the present invention is to provide a subminiature variable delay line.

Still another object of the present invention is to provide a variable delay line which is easy to manufacture.

In order to attain the above-mentioned objects, the present invention comprises an inductance element consisting of a single layer solenoid formed by winding a conductor at a prescribed pitch with a spacing between adjacent turns, capacitors connected between said conductor and ground at each turn of said inductance element, a fixed contact array consisting of fixed contacts formed on said conductor at each turn of said inductance element and a movable contact element for sliding on said fixed contact array while repeating alternately the single-contact with said fixed contact and the multicontacts with the fixed contacts adjoining each other.

According to the present invention thus constituted, it is possible to obtain a subminiature variable delay line with a fast rise time which enables adjustment of the delay time in precise intervals.

BRIEF DESCRIPTION OF THE DRAWINGS

FIG. 1 is a longitudinal sectional view (partially shown as a front view) of one embodiment of the variable delay line according to the present invention;

FIG. 2 is a cross sectional view of the variable delay line illustrated in FIG. 1;

FIG. 3, FIG. 4 and FIG. 5 are equivalent circuit diagrams of the variable delay lines illustrated in FIG. 1;

DETAILED DESCRIPTION OF THE PREFERRED EMBODIMENTS

Figure 6:
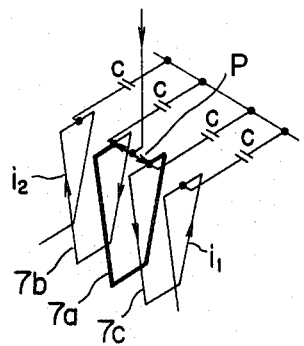
FIGS. 6 and 7 are schematic diagrams showing the operation of the variable delay lines as illustrated in FIG. 1.

In FIGS. 1 and 2, a ground electrode 3 is formed on the upper side of a non-magnetic bobbin 1 in the form of a rod having a rectangular transverse section with the narrow surface extending in the longitudinal direction. A dielectric plate 5 is formed on said ground electrode 3. On the external periphery of the bobbin 1 including said dielectric plate 5, a conductor strip 7 is would so as to constitute a single layer solenoid of a prescribed pitch with spacing maintained between adjacent turns, so as to form an inductance element 9.

On the dielectric plate 5, the conductor strip 7 constitutes a capacitor electrode 11 and a capacitor is formed between the conductor said ground electrode 3 at each turn of the inductance element 9. In this manner, a lumped constant delay line comprising the inductance of plural sections, one turn being one section, is formed. Said capacitor electrodes 11 also serve as fixed contact 13 which will be described later and form a fixed contact array 15 consisting of fixed contacts 13 corresponding in number to the number of turns of said conductor strip 7.

The delay line is disposed within a housing 17 by securing the under surface of the bobbin 1 opposite to the surface forming the capacitor to the base of the housing 17. An electrode 19 is formed on the inner upper side of the housing 17 and said electrode 19 is connected to an input terminal 21 installed at the base of the housing 17 through an inner side surface of the housing 17. Furthermore, the ground electrode 3 of said bobbin 1 is connected to the input and output terminals 23, 25 installed at the base of the housing 17 at the vicinities of both end sides of the bobbin 1. Furthermore, an end of the conductor strip 7 is connected to an output terminal 27 installed at the base of the housing 17.

A spring holder 31 is arranged with an upper portion thereof protruding from a sliding groove 29 formed along the fixed contact array 15 at the top portion of the housing 17. A sliding spring 35 forms a movable contact element. The spring is made of a conductive elastic member formed in the shape of a bow, and is disposed within the concave portion 33 formed at the lower portion of said spring holder 31. Either side portion of said sliding spring 35 may slidably and elastically contact the electrode 19 formed on the inner upper side of the housing 17 and furthermore said sliding spring 35 is provided with a movable contact 37 formed in the shape of a bow. The movable contact 37 may mutually elastically contact each of the fixed contacts 13 of the fixed contact array 15 or two adjacent fixed contacts 13.

A knob 39 is fixed to the upper portion of the spring holder 31. When the knob 39 is moved along the sliding groove 29 of the housing 17, the movable contact 37 slides on the fixed contact array 15 while alternatingly contacting each of the fixed contacts 13 individually and then two fixed contacts 13 adjacent to each other, owing to a biasing action caused by the elastic deformation of the sliding spring 35. Accordingly, the input terminal 21 of the housing 17 is connected to a definite fixed contact or contacts 13 through the electrode 19, the sliding spring 35 and the movable contact 37. The sliding spring 35 forcibly contacts the fixed contact 13 and accordingly when the same encounters concave portions 41 formed between the conductor strips 7 of the delay line, the movable contact 37 of the sliding spring 35 drops in the concave portions 41 as the spring holder 31 is moved. This creates an operational clicking sound and furthermore serves to make multi-contact with two adjacent fixed contacts 13.

Next, the operation of the variable delay line according to the present invention constituted as described above will be considered with reference to an equivalent circuit diagram.

FIG. 3 is an equivalent circuit diagram of the variable delay line according to the present invention as illustrated in FIG. 1, including an external circuit thereof, in which the movable contact 37 shown in full lines illustrates the multi-contact state and the movable contact 37 shown in broken lines illustrates the single-contact state.

The variable delay line as shown in FIG. 1 is of an derived m-type constitution so that plural inductances 1 (each turn) and condensers C are alternately connected in ladder form, and a coupling coefficient (a) primarily describes the coupling between the inductances L of the adjacent sections.

Resistor Ro is connected between the output terminals 25, 27 and a further resistor Ro is connected between the other end of the conductor strip 7, which is the beginning of the winding of the conductor strip 7, and ground (omitted in FIG. 1). Pulse signal generator PG is connected between the input terminals 21, 23 with the output impedence Ro/2. Reference mark Lw in FIG. 3 denotes the inductance of the electrode 19 or the sliding spring 35, etc. and Cs is a stray capacitance. The delay time td due to the inductance of one section becomes;

$$td = \sqrt{L(1 + 2a) \cdot C} \quad (1)$$

and the characteristic Ro becomes $$Ro = \sqrt{\frac{L(1 + 2a)}{2}} \quad (2)$$

The input signal from the pulse signal generator PG is input into the fixed contact 13 of the delay line through Lw, the sliding spring 35 and the movable contact 37, and the energy is equally divided between the inductances 1 on the right and left sides of said fixed contact 13. In FIG. 3, the signal transmitted to the right side is output between the output terminals 25, 27 after a delay time comprising the delay time td of one section multiplied by the number of the sections to the right of the input point P (the fixed contact 13 to which the movable contact 37 is connected. (See FIG. 4), and absorbed into the terminal resistor Ro as a load.

Accordingly, the delay time of the output signal at 25, 27 may be varied by moving the knob 39 to slide the movable contact 37 as shown in FIG. 1. On the other hand, the signal transmitted to the left side from the input point is applied to the terminal resistor Ro within the housing 17 after a delay time obtained by multiplying td by the number of sections to the left from the input point P.

Next, the operation with reference to the multi-contact state and the single-contact state according to the present invention will be explained.

First, explanation will be made with reference to the multi-contact state. In such a state, one inductance L may be short-circuited by the movable contact 37, and accordingly two capacitors C are connected in parallel so that the sections to the right and left sides from the input point P of the inductance element 9 may be considered as shown in FIG. 4.

In FIG. 4, when the delay line is viewed from the inductance Lw, the network of the characteristic Ro consists of two circuits connected in parallel and the characteristic becomes Ro/2. Accordingly, when the following equations are satisfied $$Lw = \frac{L(1 + 2a)}{2}, \quad Cs = C \quad (3)$$

the characteristic of the Lw portion becomes $$\sqrt{\frac{L(1 + 2a)}{2} / 2C} = \frac{1}{2}\sqrt{\frac{L(1 + 2a)}{C}} = \frac{Ro}{2}$$

from the above formula (2); and the capacitance 2C may be divided into one capacitor with capacitance C and two capacitors with capacitance C/2; and the left and right sides divided by broken line X—X are matched at Ro/2. Furthermore, the delay time of the Lw portion becomes $$\sqrt{\frac{L(1 + 2a)}{2}(C + Cs)} = \sqrt{L(1 + 2a) \cdot C} = td$$

from the above formulas (1) and (3). The delay time of the Lw portion is observed only for one section L of the inductance. An electric current flowing into the conductor strip 7a from the sliding spring 35 through the movable contact 37 is divided into the left and right sides at the input point P as shown in FIG. 6 and one portion thereof flows into the capacitors C while the remaining portion flows into the conductor strips 7b, 7c of the left and right sides in equal currents $i_1$, $i_2$ with reverse directions. In FIG. 6, numerical reference 7a shows the conductor strip which is short-circuited. The electromotive force caused by the electric currents $i_1$, $i_2$ is negated mutually and as a result, no short-circuit current flow and there is no effect of any loss. On the other hand, the conductor strip 7b, 7c adjacent to the short-circuited conductor 7a have the inductance value $L(1+a)$ because of one-side mutual induction.

The coupling coefficient (a) between the inductances L as shown in FIG. 3 is usually around 0.15 and accordingly the characteristic impedance and the delay time in said sections becomes lower by about seven percent as compared with the values of the above formulas (1) and (2). This represents the fundamental characteristic with respect to the multi-contact state.

Next, operation in the single contact state will be set forth hereinbelow.

In single contact operation, the inductances L may not be short-circuited by the movable contact 37 and accordingly the capacitance of the capacitor at the input point P becomes C and the sections to the left and right sides from the input point P are in the state shown in FIG. 5. That is to say, the capacitance of said capacitor is divided into one capacitor with capacitance C/2 and two capacitors with capacitance C/4; and each of the left and right sides divided by broken line X—X has a slightly higher characteristic of 2 Ro; and accordingly is in a state of mismatch with the other sections. However, the distortion of the output signal wave form is hardly observed at the output terminals 25, 27, causing no problems in an actual use.

Figure 7:
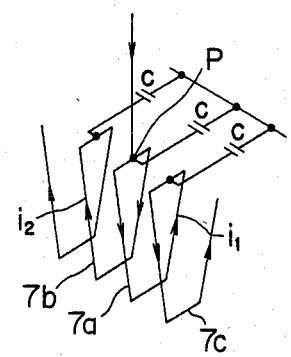

One part of the electric current flowing into the conductor strip 7a from the sliding spring 35 through the movable contact 37 flows into the capacitor C at the input point P as shown in FIG. 7 and the remaining current flows into the left and right conductor strips 7b, 7c in equal amounts $i_1$, $i_2$ in reverse direction.

That is to say, the right and left conductor strips adjacent to each other at the input point P are coupled by a coupling coefficient $(-a)$, and each of the conductor strips thus adjacent is further coupled by a coupling coefficient $(+a)$ to another conductor strip adjacent thereto. Accordingly, the value of the inductance as a delay element becomes $L(1+a-a)=L$, this value being lower as compared with that of the multi-contact state. For this reason, in the single-contact operation, the capacitance of the capacitor becomes lower by $\frac{1}{2}$ and the inductance becomes lower by $1/(1+a)$ at the input point P as compared with the multi-contact state; and as a result, the delay time is shortened by about 0.3td as compared with that of the multi-contact state. Accordingly, with respect to the variable delay line as shown in FIG. 1, the delay time is shortest when the movable contact 37 is moved to the right end side. The above point becomes a reference point with respect to the delay time variation range; and when the movable contact 37 is moved to the left in turn, the multi-contact and the single-contact states are repeated alternately and the delay time of a single obtainable at the output terminals 25, 27 varies as 0.3td, td, 1.3td, 2td, 2.3td . . . in relation to the reference point.

As a result, it becomes possible to realize a more precise stepwise variation than that obtainable according to a conventional delay line, i.e. the variation of the delay time in the fashion, td, 2td . . . obtainable by repeating single-contact states. Therefore, the delay time intervals thus obtained become shorter and an adjustment error accompanying the variation of the delay time is small, the maximum of which is about +0.35td. By reference, the conventional adjustment error was +0.5td.

Furthermore, the variable delay line according to the present invention does not have an off state because the movable contact 37 always contacts either one or both of the adjacent fixed contacts 13 at the time of movement of the knob 39. For this reason, when the delay line is incorporated in an electronic machine, the delay time can always be varied in an operational state thereof so that adjustment is easy. Further a stabilization of the characteristic can also be attained.

Figure 8:
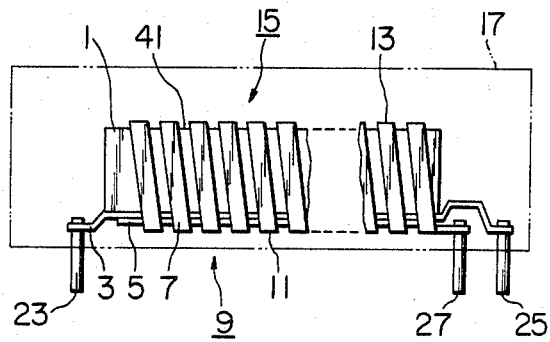
FIG. 8 is a schematic front view showing another embodiment of the present invention.

FIG. 8 shows another embodiment according to the present invention (Details of the housing are omitted therein).

The variable delay line according to this embodiment is composed of the capacitor electrode 11 formed at a lower end portion of the bobbin 1 so as to secure the inductance element 9 to the base of the housing 17. In such a constitution, the ground electrode 3 may be connected to the terminals 23, 25 at a short distance and accordingly the characteristic may be more stabilized. However, on the other hand, a mismatching state in the case of the multi-contact state of the movable contact 37 and a matching state in the case of the single-contact state may be observed reversely to the embodiment as illustrated in FIG. 1. However, this should cause no problem in the operation of the above-mentioned variable delay line and a variation of the delay time in precise intervals, which is an object of the present invention, if possible.

Figure 9:
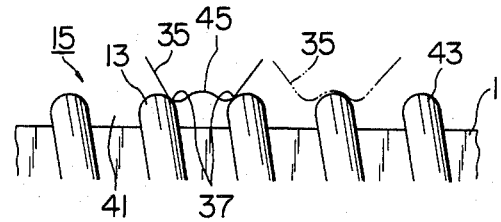
FIG. 9 is a schematic diagram showing another embodiment of the movable contact element according to the present invention.

In FIG. 9, furthermore, another embodiment is shown with respect to the conductor strip 7 and the movable contact 37 of the variable delay line according to the present invention. According to this embodiment, wire 43 with a circular cross section is employed and furthermore a concave fitting portion 45 is formed at the end portion of the movable contact 37. As shown with the double broken line in FIG. 9, a positional stabilization of the movable contact is secured by fitting the fitting portion 45 to the wire 43 in the single-contact state.

Furthermore, according to the above-mentioned embodiment, each capacitor is respectively connected to each turn of the conductor of the inductance element 9. According to the present invention, however, objects of the invention can also be attained in the case where plural capacitors are dispersely connected to each turn. Objects of the present invention may also be attained by forming a conductive layer on the surface of the alumina ceramics bobbin by means of plating etc. and then processing the same by means of photoetching or laser beam etching so that the conductor may become a solenoid, thus enabling the variable delay line to be miniaturized.

Figure 10:
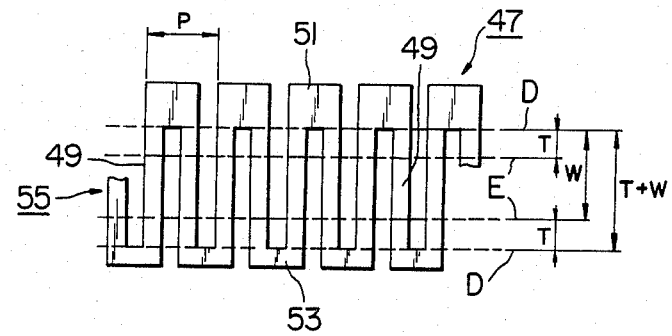
FIGS. 10 and 11 are a developed plane view and a perspective view, respectively each showing another embodiment of the inductance element according to the present invention.
Figure 11:
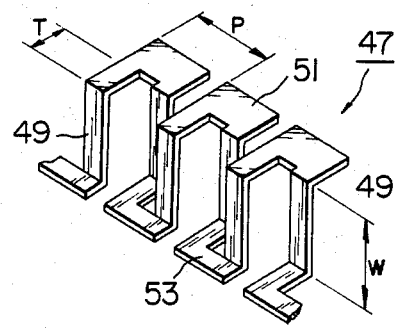

FIGS. 10 and 11 are a developed plane view and a perspective view each showing another inductance element usable in the variable delay line according to the present invention. The inductance element 47 as shown in FIG. 10 is composed of plural conductor strips 49 connected integrally in series and arranged in parallel with a prescribed pitch P with a prescribed space therebetween. The strips 49 are connected by folded-back connecting portions 51, 53 which, as shown in FIG. 11, are formed by bending.

In particular, the "winding" of FIG. 11 may be obtained from the planar conductor of FIG. 10 by bending the latter along lines D and E shown in FIG. 10. In so doing, each leg or strip 49 is bent along either upper line D and lower line E, or along upper line E and lower line D, in an alternating fashion with respect to adjacent legs. The upper and lower bends are respectively made in opposite directions with respect to the plane of the strip 49, so that upper and lower portions 51, 53 appear as bent over portions. Adjacent legs 49 are in this manner offset from one another by a distance T. Thus, the inductance element 47 of solenoid form having pitch P as shown in FIG. 11 is constituted.

The inductance element 47 has a rectangular sectional hollow space formed by a long side W and short side T, and the folded-back connecting portions 51, 53 are formed to extend in parallel in reverse directions with respect to each other. Either of the folded-back connecting portions 51, 53 may function as the fixed contacts of the fixed contact array.

Furthermore, when the conductor strips 49 of the inductance element 47 are formed of a conductor plate by means of photo-etching, etc., a number of conductor strips 49 with accurate dimensions and precision may be formed at the same time. The same may also be formed by means of punching, etc. Regarding the inductance element 47, it is possible to insert a bobbin into said sectional hollow space. In this case, however, the bobbin material must have low loss within the ultra-high frequency band (for example 1 GHz or more), and accordingly an air core solenoid constitution with low loss and low dielectric constant is suitable.

As mentioned hereinabove, the variable delay lines according to the present invention have a fast rise characteristic of less than 1 ns. and enable the variation of the delay time in precise intervals, and furthermore the precision of the variation is also improved.

What is claimed is:

1. A variable delay line, comprising; an inductance element comprising a conductor formed into a plurality of turns having a prescribed pitch, with a space being maintained between adjacent turns, a capacitor connected between said conductor and ground at each turn, a fixed contact array consisting of fixed contacts formed on said conductor at each turn, and a movable contact element for slidingly contacting said fixed contact array, said movable contact element being capable of engaging single ones of said fixed contacts at a first set of positions thereof, and being capable of engaging two adjacent ones of said fixed contacts at a second set of positions thereof.

2. A variable delay line as claimed in claim 1, wherein said inductance element comprises a wound wire.

3. A variable delay line as claimed in claim 1, wherein said inductance element comprises a conductor strip formed as a single layer solenoid.

4. A variable delay line as claimed in claim 1, wherein said inductance element is composed of plural conductor strips alternatingly disposed in a pair of planes, said strips being connected to one another by folded-back connecting members.

5. A variable delay line as claimed in claim 4, wherein said fixed contact array comprises said fixed contacts, said fixed contacts being constituted by said folded-back connecting members.

6. A variable delay line as claimed in any one of claims 2 to 5, wherein said movable contact element comprises a conductive elastic member formed in a shape of a bow and provided with a movable contact for contacting said fixed contacts.

7. A variable delay line as claimed in claim 6, wherein said movable contact of the movable contact element is formed so as to be able to drop between adjacent fixed contacts so as to establish contact with both said adjacent fixed contacts.

8. A variable delay line as claimed in claim 6, wherein said movable contact element is provided with a fitting portion capable of being fitted to a fixed contact.

* * * * *